(12) United States Patent
Obert et al.

(10) Patent No.: US 6,636,414 B2
(45) Date of Patent: Oct. 21, 2003

(54) HIGH POWER VARIABLE SLIDE RF TUNER

(75) Inventors: Thomas L. Obert, Claremont, CA (US); Kenneth W. Brown, Yucaipa, CA (US); Thomas A. Drake, Yucaipa, CA (US)

(73) Assignee: Raytheon Company, Lexington, MA (US)

( * ) Notice: Subject to any disclaimer, the term of this patent is extended or adjusted under 35 U.S.C. 154(b) by 4 days.

(21) Appl. No.: 10/041,364

(22) Filed: Jan. 8, 2002

(65) Prior Publication Data

US 2003/0128495 A1 Jul. 10, 2003

(51) Int. Cl.[7] ............................. H01G 5/04; H01G 5/01
(52) U.S. Cl. ........................ 361/292; 361/278
(58) Field of Search ................................. 361/272, 278, 361/280, 281, 287–289, 292, 294–296, 300

(56) References Cited

U.S. PATENT DOCUMENTS 5,818,683 A * 10/1998 Fujii ........................ 361/277

* cited by examiner

Primary Examiner—Dean A. Reichard
Assistant Examiner—Eric Thomas
(74) Attorney, Agent, or Firm—Thomas J. Finn; Colin M. Raufer; Glenn H. Lenzen, Jr.

(57) ABSTRACT

A high power slide tuning capacitor (200) integrated into a circuit board adapted to function at RF and microwave frequencies. The capacitor (200) includes a dielectric substrate (26) with a cavity (28) cut into a side of the substrate (26); a ground plane (24) mounted on a bottom surface of the dielectric substrate (26); a microstrip patch (22) mounted on a top surface of the dielectric substrate (26) and positioned above the cavity (28); and a movable dielectric stub (30) which engages the cavity (28) such that a variable length of the stub (30) is positioned beneath the microstrip patch (22). The microstrip patch (22) can be coupled to a desired circuit trace (20), effectively forming a shunt capacitor to ground.

10 Claims, 2 Drawing Sheets

HIGH POWER VARIABLE SLIDE RF TUNER

BACKGROUND OF THE INVENTION

1. Field of the Invention

The present invention relates to electronic circuits and systems. More specifically, the present invention relates to variable capacitors for use in high power radio frequency applications.

2. Description of the Related Art

High power radio frequency (RF) transistors are ever increasing in power. In the last several years, the power of RF transistors in the cell phone band has doubled approximately every two years. Amplifier circuits often use several of these transistors together to generate thousands or even millions of watts of power. However, the power handling capability of other lumped element components that comprise a high power transistor amplifier (e.g. capacitors, resistors, inductors, etc.) has not increased nearly as rapidly. Therefore, the design of high power RF amplifiers using the newest high power transistors is difficult due to the lack of high power lumped element components. In particular, variable RF tuning capacitors that can handle the required power levels are not available.

In a typical high power RF microstrip amplifier, a 50 ohm input transmission line transitions into transmission lines of much lower impedances (the wider transmission lines). At the transition between different width lines, a shunt capacitor to ground is needed. The low impedance line is then connected to the input (e.g. gate) of the transistors. A similar embodiment is used at the output (e.g. drain) of the transistors.

These types of matching networks are used to transform 50 ohms into the smaller input/output impedance (~1 ohm) of the transistor. By making the shunt capacitors variable, the matching networks can be tuned. This tuning is necessary to account for differences in transistor performance, circuit board characteristics, and circuit etching tolerances as well as variations in any other lumped element components that my be in the amplifier circuit.

Lumped element variable capacitors are available which can handle up to 200 watts of power. However, if the power output is pushed just a small percentage beyond this, the capacitors will fail. Higher power variable capacitors are available, but they are not suitable at RF frequencies (they self resonate below 900 MHz).

Hence, a need exists in the art for an improved capacitor which can handle the voltage and current levels applied in high power, high frequency applications.

SUMMARY OF THE INVENTION

The need in the art is addressed by the variable capacitor of the present invention. In a most general implementation, the inventive capacitor includes a dielectric substrate with a cavity disposed therein. A first conductive surface is mounted on a first side of said cavity and a second conductive surface is mounted on a second side of the cavity. The second conductive surface is mounted so that it is at least partially diametrically opposed to the first conductive surface. In accordance with the present teachings, a dielectric stub is provided which is adapted for reciprocal motion within the cavity.

In a specific implementation, the first conductive surface is a ground plane and the second conductive surface is a microstrip patch. In the illustrative embodiment, the cavity is rectangular with four rectangular side walls, a rectangular top and a rectangular bottom. In the illustrative embodiment, the patch and stub are also rectangular. An electro-mechanical actuator reciprocates the dielectric stub into and out of the cavity to provide a desired amount of capacitance in response to a control system.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
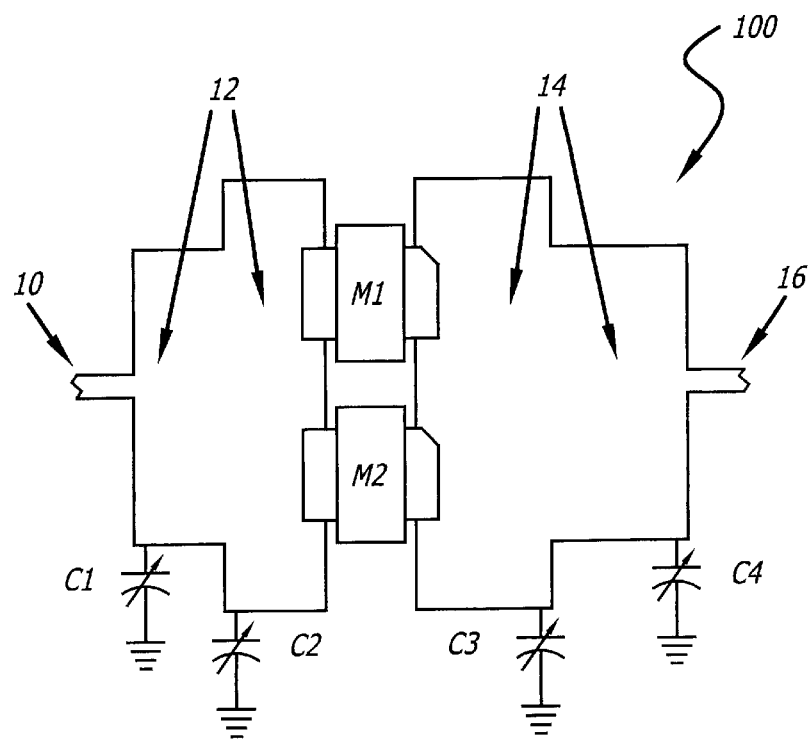
FIG. 1 is a diagram of a conventional high power RF microstrip amplifier.

FIG. 1 is a diagram of a typical embodiment of a conventional high power RF microstrip amplifier 100. A 50 ohm input transmission line 10 transitions into transmission lines 12 of much lower impedances (the wider transmission lines). At the transition between different width lines, a shunt capacitor (C1, C2) to ground is placed. The low impedance line 12 is then connected to the input (e.g. gate) of the transistors (M1, M2). A similar embodiment is used at the output (e.g. drain) of the transistors. The output of the transistors (M1, M2) is connected to low impedance transmission lines 14 which transition to a 50 ohm output transmission line 16. At the transition between different width lines, a shunt capacitor (C3, C4) to ground is placed.

The capacitors (C1, C2, C3, C4) are typically commonly available lumped element capacitors. These capacitors, however, cannot handle the power levels available from high power RF transistors. The present invention is a high power slide tuning capacitor that is integrated into the circuit board itself which can function at RF and microwave frequencies.

Figure 2:
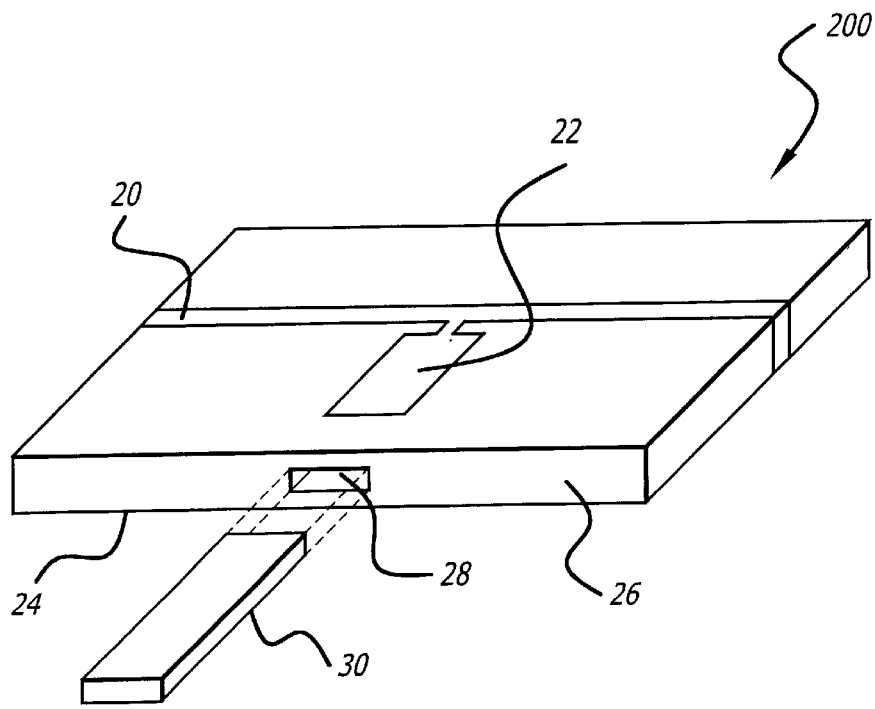
FIG. 2 is a diagram showing a slide tuner capacitor designed in accordance with the teachings of the present invention.

FIG. 2 is a diagram showing a slide tuner capacitor 200 designed in accordance with the teachings of the present invention. A distributed capacitance 22 is etched into the microstrip circuit, shunting a desired circuit trace 20. On the underside of the circuit board 26, a cavity 28 is milled beneath the distributed capacitor 22. A heat sink or ground plane 24 is then installed under the circuit board 26. The cavity 28 forms a channel in the circuit board 26 under the distributed capacitance 22. A rectangular piece of dielectric material 30, slightly smaller than the channel 28, is then inserted into the channel 28. By changing the depth of insertion of this dielectric slide tuner 30, the value of capacitance of the distributed shunt capacitor 22 is changed.

Figure 3:
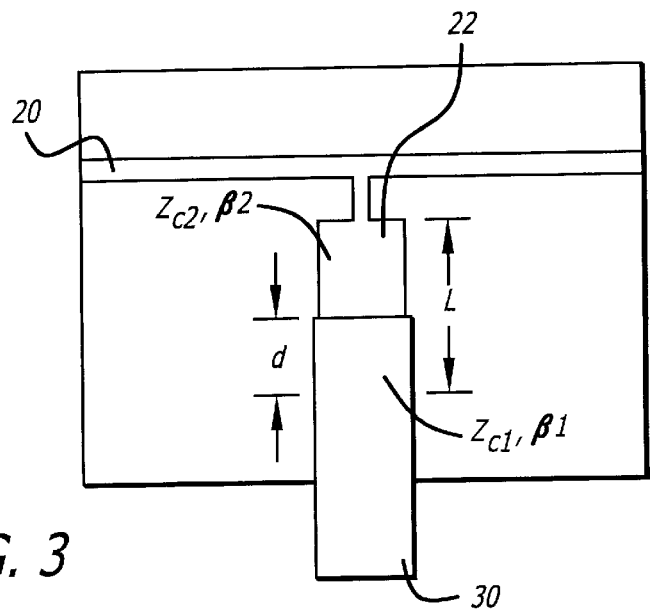
FIG. 3 a diagram showing the critical dimensions of a slide tuner capacitor designed in accordance with the teachings of the present invention.

FIG. 3 a diagram showing illustrative dimensions of a slide tuner capacitor designed in accordance with the teachings of the present invention. In this figure, the length of the distributed element capacitor 22 is L and the amount of insertion of the dielectric slide tuner 30 is d (the length of the slide tuner 30 which lies under the distributed capacitor 22).

For frequencies around 1000 MHz, in the frequency range between those designated for lumped element and distributed element, this invention can be modeled either as a parallel plate capacitor or as a transmission line stub.

In the parallel plate model, the ground plane 24 is one plate and the distributed capacitance 22 is the other plate. The region between the two plates is partially filled with dielectric (length d), and partially filled with air (length L−d). If this is modeled using Maxwell's equation, it is found that there is capacitance at this port, and changing the length of dielectric that is between the two plates effectively changes the capacitance.

In the transmission line model, the distributed capacitance 22 is a transmission line which is open circuited at one end. Electromagnetic waves travel in the region between the distributed capacitance 22 and the ground plane 24. This region is partially filled with dielectric (length d), and partially filled with air (length L−d). Waves traveling in the dielectric will have a shorter electrical wavelength than those in air. Thus, if a larger length d of the dielectric stub 30 is inserted beneath the distributed capacitance 22, a larger capacitance is found at that port.

Using mathematical software to solve for these two models results in the same solution. The shunt capacitance C can be shown to be:

$$C = \frac{1}{2\pi F} \frac{Z_{c1}Z_{c2} + Z_{c2}^2 \tan(\beta_1 d)\tan[\beta_2(L-d)]}{Z_{c2}\tan(\beta_1 d) + Z_{c1}\tan[\beta_2(L-d)]}$$

where F is the frequency, $Z_{c1}$ and $\beta_1$ are the characteristic impedance and wave number, respectively, of the distributed capacitor line for the portion of the line with the slide tuner underneath, and $Z_{c2}$ and $\beta_2$ are the characteristic impedance and wave number, respectively, of the distributed capacitor line for the portion of the line without the slide tuner underneath.

By changing the value of d, the capacitance C can be varied over a wide range. Slide tuners of this nature have been successfully built and tested that vary in range from a couple of picofarads up to 20 or 30 picofarads.

This invention can be practiced using standard materials and techniques for fabricating printed circuit boards. The dielectric slide tuner 30 can be fabricated using the same or different material as the dielectric substrate of the circuit board. Using a slide tuner with a higher dielectric coefficient than that of the circuit board will result in a more pronounced capacitance effect. This allows the use of a smaller patch of conductor for the distributed capacitor 22; however, if the patch becomes too small, the distance over which the dielectric tuner 30 can be slid becomes too small, making the tuned point difficult if not impossible to achieve.

One method for producing the channel 28 follows. Those skilled in the art will appreciate that any method for producing the channel can be used without departing from the scope of the present teachings. After a circuit has been etched onto a circuit board, the board has copper (or another conductor) on both sides of the board: one side has been etched and the other is the ground plane. The channel 28 is carefully cut out from the side with the ground plane, cutting away some of the copper of the ground plane. A heat sink (a plate made of aluminum or some other conductor) is then attached to the ground plane. This essentially replaces the original ground plane so that the portion which was cut out is no longer a problem.

The equation given above for the capacitance C assumes that all of the dielectric substrate between the distributed capacitor 22 and the ground plane 24 is removed. In practice, attempting to remove all of the dielectric would likely result in destroying the copper etching which is very thin. An effective compromise is to remove about 70–80% of the dielectric, leaving the rest as a structural support for the copper etching.

An additional advantage of the slide tuner is that it can be easily adapted for robotic tuning. Conventional tuning capacitors require an operator to manually turn a screw next to the board. With the higher power amplifiers currently being designed, this has become unsafe.

Figure 4:
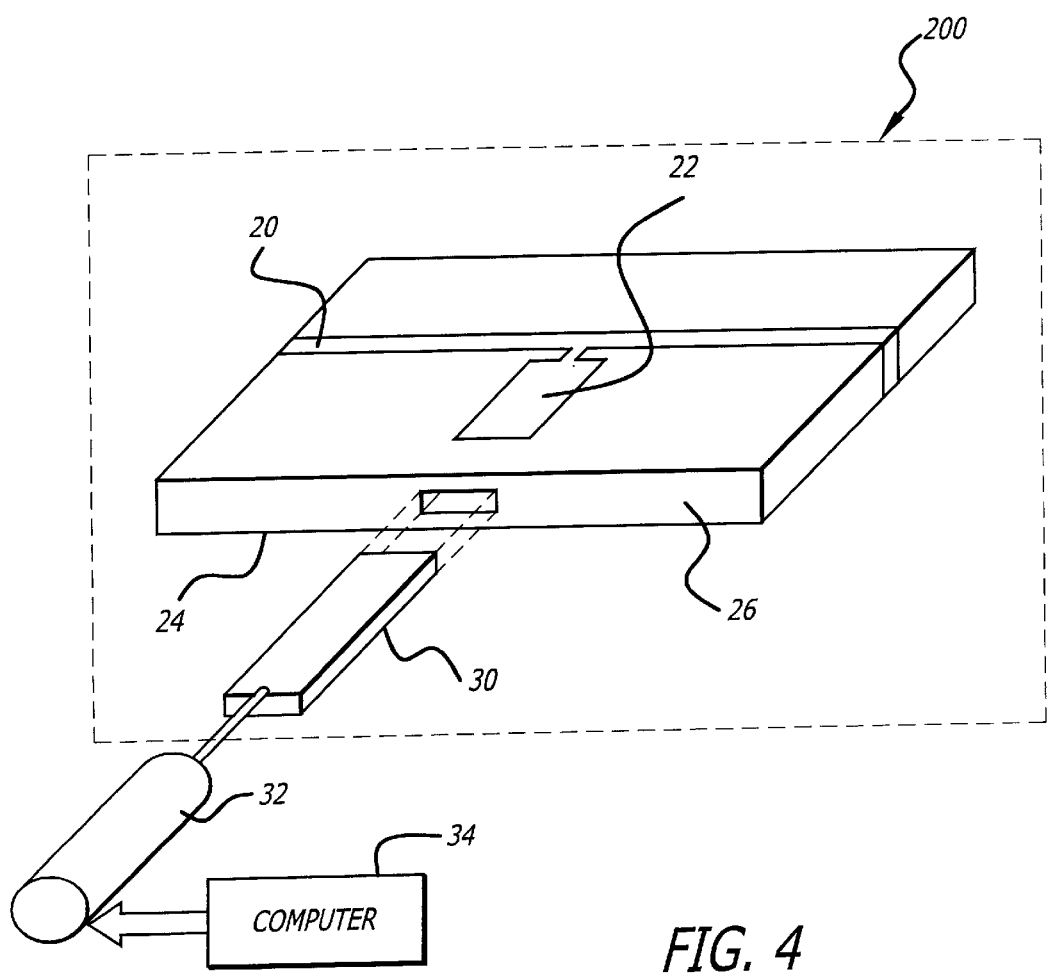
FIG. 4 is a diagram of a slide tuner capacitor with robotic tuning designed in accordance with the teachings of the present invention.

FIG. 4 is a diagram of a slide tuner capacitor 200 with robotic tuning designed in accordance with the teachings of the present invention. In this setup, the dielectric slide tuner 30 is connected to an electro-mechanical actuator 32. A computer or controller 34 drives the actuator 32 to automatically slide the dielectric 30 to provide a desired amount of capacitance in response to user and/or system inputs. Those skilled in the art will appreciate that this type of arrangement can be used in an automated test/tune environment, where the amplifier performance can be automatically optimized via the slide tuner positions.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A variable capacitor comprising:
   a dielectric substrate with a cavity disposed therein;
   a first conductive surface mounted on a first side of said cavity;
   a second conductive surface mounted on a second side of said cavity, at least partially diametrically opposed to said first conductive surface; and a dielectric stub adapted for reciprocal motion within said cavity.

2. The invention of claim 1 wherein said first conductive surface is a ground plane.

3. The invention of claim 1 wherein said second conductive surface is a microstrip patch.

4. The invention of claim 1 wherein said cavity is rectangular with four rectangular side walls, a rectangular top and a rectangular bottom.

5. The invention of claim 3 wherein said patch is rectangular.

6. The invention of claim 1 wherein said stub is rectangular, having four rectangular side walls, a rectangular top and a rectangular bottom.

7. The invention of claim 3 wherein said microstrip patch is coupled to a circuit trace.

8. The invention of claim 1 wherein said capacitor further includes means for moving said dielectric stub linearly within said cavity.

9. The invention of claim 8 wherein said means for moving said dielectric stub includes an electro-mechanical actuator.

10. A system for providing a variable capacitance comprising:
- a dielectric substrate with a cavity disposed therein;
- a ground plane mounted on a first side of said cavity;
- a microstrip patch mounted on a second side of said cavity, at least partially diametrically opposed to said ground plane;
- a dielectric stub adapted for reciprocal motion within said cavity;
- an electro-mechanical actuatoroperatively coupled to said stub; and
- means for providing a control signal to said electro-mechanical actuator whereby said stub is inserted into said cavity to provide a predetermined amount of capacitance.

* * * * *